United States Patent
Charette

(10) Patent No.: US 10,687,388 B2
(45) Date of Patent: Jun. 16, 2020

(54) MINIATURIZED WIRELESS ROUTER

(71) Applicant: Keith Charette, Fairfield, CT (US)

(72) Inventor: Keith Charette, Fairfield, CT (US)

(73) Assignee: Ventus IP Holdings, LLC, Dover, DE (US)

( * ) Notice: Subject to any disclaimer, the term of this patent is extended or adjusted under 35 U.S.C. 154(b) by 0 days.

(21) Appl. No.: 15/922,062

(22) Filed: Mar. 15, 2018

(65) Prior Publication Data

US 2018/0270901 A1 Sep. 20, 2018

Related U.S. Application Data

(60) Provisional application No. 62/472,153, filed on Mar. 16, 2017.

(51) Int. Cl.

| | | |
|---|---|---|
| *H04W 88/08* | (2009.01) | |
| *H01Q 1/22* | (2006.01) | |
| *H01Q 1/42* | (2006.01) | |
| *H01Q 5/371* | (2015.01) | |
| *H01Q 9/42* | (2006.01) | |
| *H05K 1/02* | (2006.01) | |
| *H01Q 1/38* | (2006.01) | |
| *H05K 1/16* | (2006.01) | |
| *H05K 1/03* | (2006.01) | |

(52) U.S. Cl.
CPC .......... *H04W 88/08* (2013.01); *H01Q 1/2291* (2013.01); *H01Q 1/42* (2013.01); *H01Q 5/371* (2015.01); *H01Q 9/42* (2013.01); *H01Q 1/38* (2013.01); *H05K 1/0278* (2013.01); *H05K 1/0393* (2013.01); *H05K 1/16* (2013.01); *H05K 2201/10098* (2013.01)

(58) Field of Classification Search
CPC ....... H04W 88/08; H01Q 1/42; H01Q 1/2291; H05K 1/0278
USPC ......................................................... 455/561
See application file for complete search history.

(56) References Cited

U.S. PATENT DOCUMENTS

| | | | | |
|---|---|---|---|---|
| 6,025,805 | A * | 2/2000 | Smith | H01Q 1/243 343/700 MS |
| 6,426,814 | B1 * | 7/2002 | Berger | H01Q 3/245 343/753 |
| 7,167,929 | B2 | 1/2007 | Steinmetz et al. | |
| 2009/0316612 | A1 | 12/2009 | Poilasne et al. | |
| 2014/0028525 | A1 * | 1/2014 | Ying | H01Q 1/243 343/893 |
| 2015/0029062 | A1 | 1/2015 | Ng et al. | |
| 2015/0270597 | A1 | 9/2015 | Kough et al. | |

OTHER PUBLICATIONS

International Search Report dated Jul. 9, 2018 from corresponding PCT application No. PCT/US18/22596.

\* cited by examiner

*Primary Examiner* — Eugene Yun
(74) *Attorney, Agent, or Firm* — Grogan, Tuccillo & Vanderleeden, LLP

(57) ABSTRACT

A miniaturized wireless router including a housing and at least one network interface. The at least one network interface includes a curved antenna disposed within the housing.

17 Claims, 7 Drawing Sheets

MINIATURIZED WIRELESS ROUTER

CROSS-REFERENCE TO RELATED APPLICATIONS

This application claims priority to and the benefit of U.S. Provisional Application Ser. No. 62/472,153 filed on Mar. 16, 2017, the disclosure of which is incorporated herein by reference in its entirety.

BACKGROUND

Technical Field

Embodiments of the invention relate generally to computer networking devices, and more specifically, to a miniaturized wireless router.

Discussion of Art

A wireless router is a device that performs the functions of a router and also includes the functions of a wireless access point. It is used to provide access to the Internet or to a private computer network. It can function in a wired local area network ("LAN"), in a wireless-only LAN ("WLAN"), or in a mixed wired/wireless network. In particular, wireless routers offer a convenient way to connect a small number of wired and any number of wireless devices to each other, to the Internet, and for file sharing and printing.

Existing wireless routers, however, are typically too large in size/volume to fit in confined spaces, e.g., spaces having a volume less-than-or-equal-to about 8.0 square inches. Even routers on the smaller size typically require the use of one or more external antennas, known as "rabbit ears," in order to transmit and receive data, e.g., "network traffic." The rabbit ears of such routers typically have lengths on the order of five to six inches, thus increasing the effective volume occupied by such wireless routers.

What is needed, therefore, is an improved miniaturized wireless router.

BRIEF DESCRIPTION

In an embodiment, a miniaturized wireless router is provided. The miniaturized wireless router includes a housing and at least one network interface disposed therein. The housing has an effective volume of less-than-or-equal-to about 7.5 square inches.

In an embodiment, another miniaturized wireless router is provided. The miniaturized wireless router includes a housing and at least one network interface. The at least one network interface includes a curved antenna disposed within the housing.

In another embodiment, a system is provided. The system includes a miniaturized wireless router, a first network device, and a second network device. The miniaturized wireless router includes a housing and at least one network interface. The at least one network interface has a curved antenna disposed within the housing. The first network device and the second network device are operative to electronically communicate with each other via the miniaturized wireless router.

In yet another embodiment, a method is provided. The method includes placing a first network device in electronic communication with a second network device via a miniaturized wireless router that includes a housing and at least one network interface. The at least one network interface includes a curved antenna disposed within the housing.

DRAWINGS

The present invention will be better understood from reading the following description of non-limiting embodiments, with reference to the attached drawings, wherein below:

DETAILED DESCRIPTION

Figure 1:
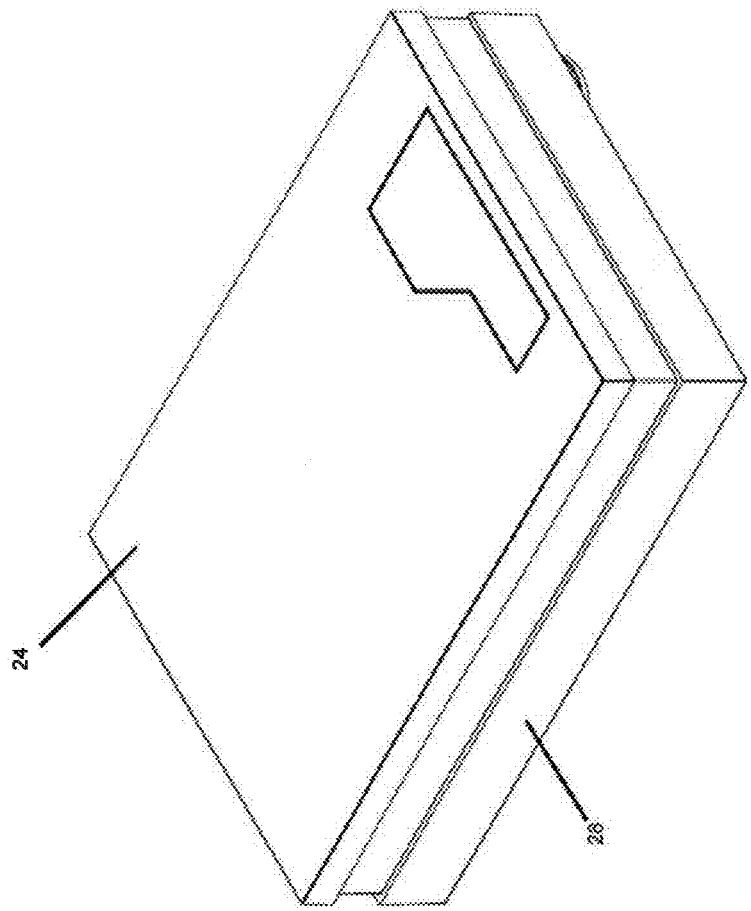
FIG. 1 is a perspective view of a miniaturized wireless router, in accordance with an embodiment of the present invention.

Reference will be made below in detail to exemplary embodiments of the invention, examples of which are illustrated in the accompanying drawings. Wherever possible, the same reference characters used throughout the drawings refer to the same or like parts, without duplicative description.

As used herein, the terms "substantially," "generally," and "about" indicate conditions within reasonably achievable manufacturing and assembly tolerances, relative to ideal desired conditions suitable for achieving the functional purpose of a component or assembly. As used herein, "electrically coupled," "electrically connected," and "electrical communication" mean that the referenced elements are directly or indirectly connected such that an electrical current may flow from one to the other. The connection may include a direct conductive connection, i.e., without an intervening capacitive, inductive or active element, an inductive connection, a capacitive connection, and/or any other suitable electrical connection. Intervening components may be present. The term "network interface," as used herein with respect to network devices, refers to a physical network connection interface e.g., an Ethernet card having a radio and/or a wired connection port such as a RJ-45 or coaxial connection or antenna, that supports a computer network connection, e.g., a TCP/IP connection. The term "real-time," as used herein, means a level of processing responsiveness that a user senses as sufficiently immediate or that enables the processor to keep up with an external process.

Further, while embodiments of the invention are described herein with respect to TCP/IP stack compliant networking devices, it will be understood that the embodiments and principals disclosed herein are equally applicable to other network paradigms, e.g., IPX/SPX, which provide for the switching and/or routing of packets.

Figure 2:
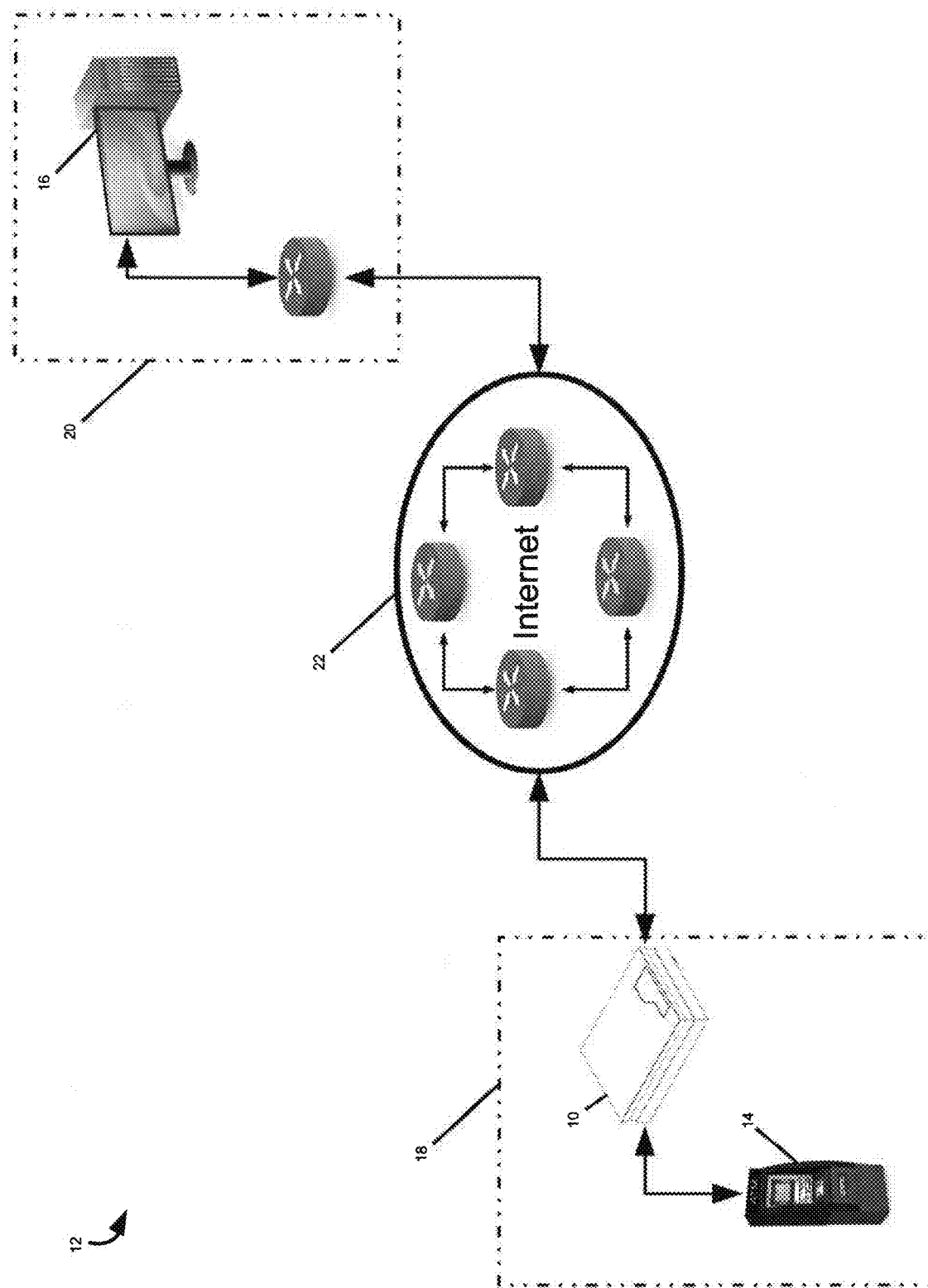
FIG. 2 is a diagram of a system that incorporates the miniaturized wireless router of FIG. 1, in accordance with an embodiment of the present invention.

Referring now to FIG. 1, a miniaturized wireless router 10, also referred to hereinafter simply as a "router," in accordance with an embodiment of the invention is shown. As illustrated in FIG. 2, the router 10 can be incorporated into a system 12 in which the router 10 is operative to place a first network device 14 in electronic communication with a second network device 16. As will be appreciated, the first 14 and second 16 network devices may be in separate networks 18 and 20, respectively, connected via the Internet 22. In such embodiments, the router 10 may act as a gateway device, e.g., an Open Systems Interconnection ("OSI") layer-3 device. As will be understood, however, the router 10 may also be behind a gateway device and function as an OSI layer-2 device, e.g., a switch. As will be discussed in greater detail below, the router 10 occupies an effective volume less-than-or-equal-to about 7.5 square inches. As such, the router 10 is ideal for use in embedded environments, e.g., Automatic Teller Machines ("ATMs"), vending machines, and/or other environments having limited space for the incorporation of networking equipment.

Figure 3:
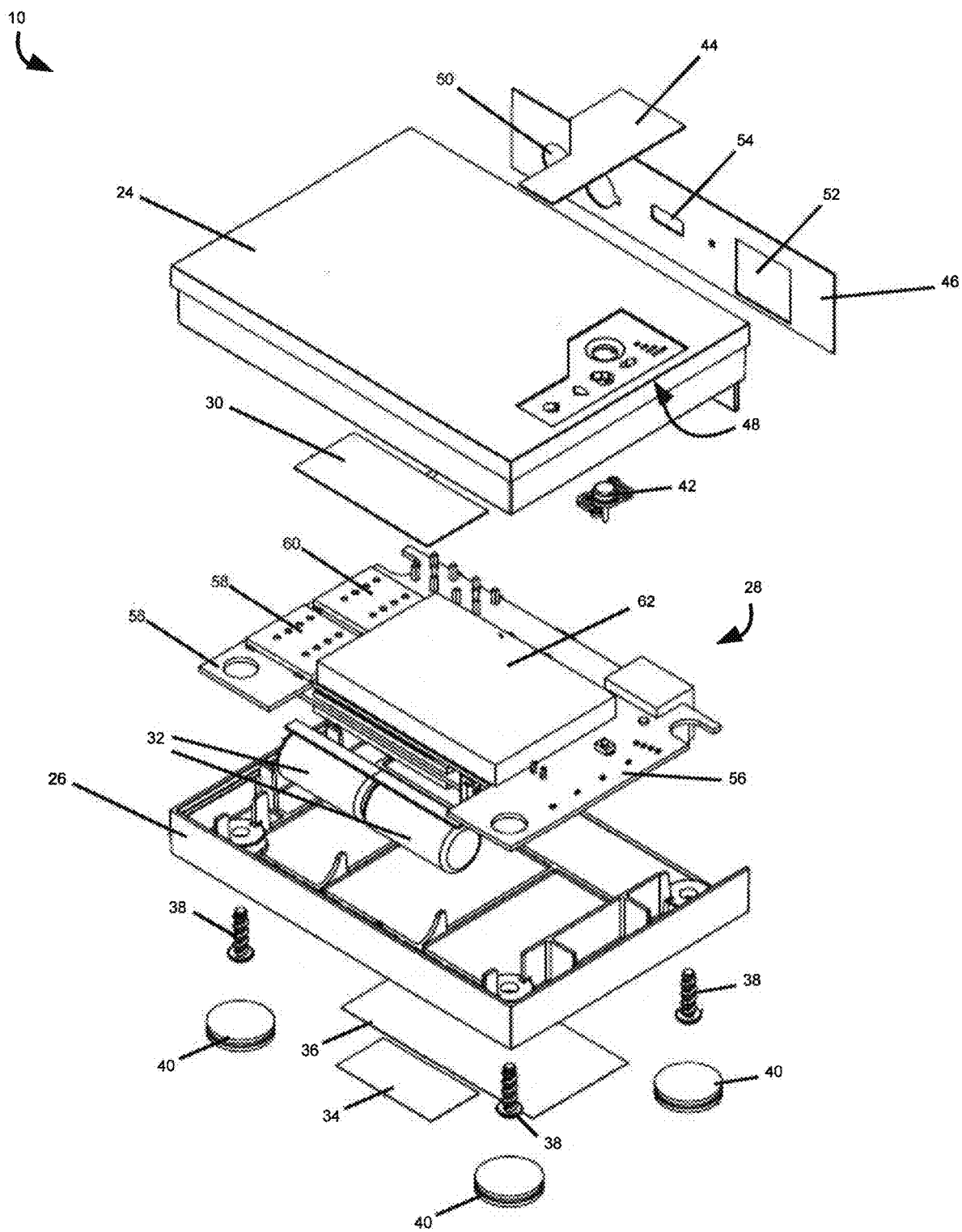
FIG. 3 is an exploded view of the miniaturized wireless router of FIG. 1, wherein the miniaturized wireless router has a printed circuit board ("PCB") assembly, in accordance with an embodiment of the present invention.

Turning now to FIG. 3, an exploded view of the router 10 is shown. In embodiments, the router 10 includes a housing, which may be formed by an upper cover 24 and a lower cover 26, having a volume less-than-or equal-to about 7.5 square inches. In embodiments, the router 10 may further include a printed circuit board ("PCB") assembly 28, one or more antennas 30, a power supply 32, e.g., batteries, one or more labels 34 and 36 disposed on the housing 24, 26, one or more fasteners 38, e.g., screws, low profile feet 40, e.g., dual lock circles, and/or a user physical input mechanism 42, e.g., a reset button.

The housing 24, 26 may be made from plastics, composites, metals that do not overly interfere with the transmission and reception of radio waves, wood, and/or any other suitable material. As shown in FIG. 3, the housing 24, 26 may have top 44 and rear 46 overlays. The top overlay 44 may fit over one or more indictor lights 48, and the rear overlay 46 may have a power input port 50, a wired network interface port 52, e.g., a RJ-45 female connector, USB 54, and/or other various connection/interface ports. The indicator lights 48 may show one or more of: a wireless signal strength; a state of the power supply 32, e.g., battery life; a connection status state, e.g., connected and receiving traffic; a connection type, e.g., LTE, WiFi, Bluetooth, and/or other various indications.

The PCB assembly 28 includes a PCB 56, the power supply 32, at least one processor 58, memory 60, e.g., random access memory ("RAM"), and a memory storage unit/drive 62, e.g., a hard disk. As shown in FIG. 3, the PCB 56 is shaped to fit around the memory storage unit 62 with the power supply 32 mounted adjacent to the memory storage unit 62.

As stated above, the power supply 32 may include one or more batteries, e.g., two AAA alkaline batteries. In other embodiments, however, the power supply may be a lithium ion battery. The power supply 32 may be charged by a power supply connected to the router 10 via the power input port 50.

The memory storage unit/drive 62 may be a hard disk, solid state, and/or any other appropriate memory storage device. For example, in embodiments, the memory storage unit 62 may be a solid state drive having a storage capacity of greater-than-or-equal to one terabyte. As will be understood, the memory storage unit 62 provides for the storage of an operating system and/or network memory shares. In embodiments, the operating system may provide for a management web interface through which a user can configure one or more settings of the router 10.

The one or more antennas 30 provide for the router 10 to electronically communicate with other network devices via one or more of: Wifi, e.g., 802.11; Bluetooth; Cellular, e.g., LTE, and/or other standard and/or proprietary wireless communication protocols. In other words, the router 10 has at least one network interface provided via at least one antenna 30. In embodiments, at least one of the antennas 30 may be a 2.4/5 GHz stand-alone 16 mm antenna. While the antenna in FIG. 3 is shown a being flat, as will be explained in greater detail below, in embodiments, the antennas 30 may be curved.

Figure 4:
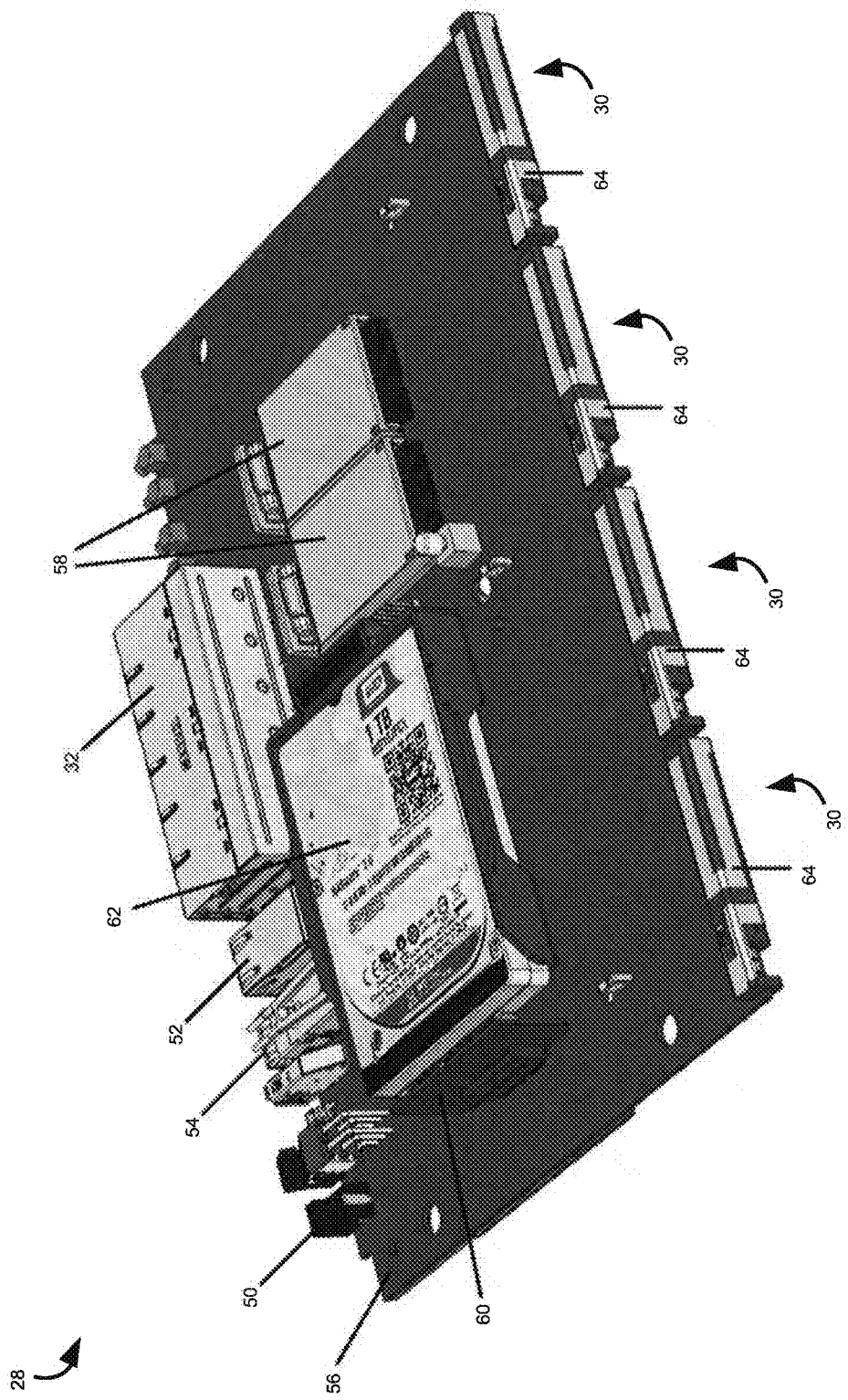
FIG. 4 is a diagram of an alternate embodiment of the PCB assembly of FIG. 3, in accordance with an embodiment of the present invention.
Figure 5:
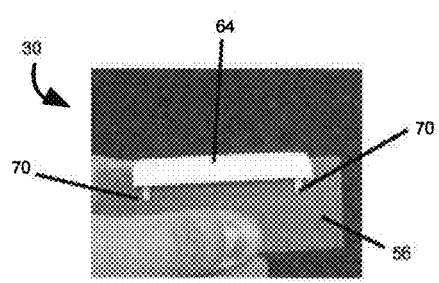
FIG. 5 is a diagram of a curved antenna of the PCB assembly of FIG. 4, in accordance with an embodiment of the present invention.
Figure 10:
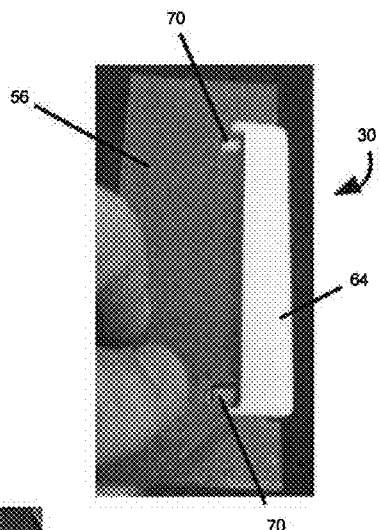
FIG. 10 is another diagram of the curved antenna of the PCB assembly of FIG. 4, in accordance with an embodiment of the present invention.
Figure 6:
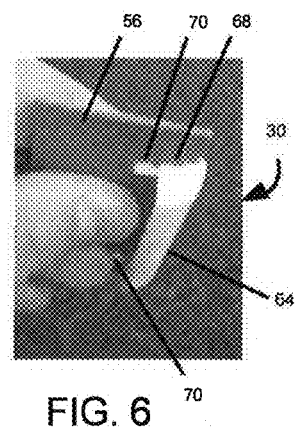
FIG. 6 is another diagram of the curved antenna of the PCB assembly of FIG. 4, in accordance with an embodiment of the present invention.
Figure 9:
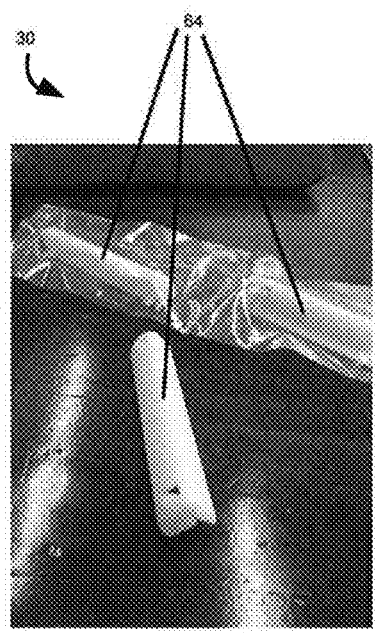
FIG. 9 is another diagram of the curved antenna of the PCB assembly of FIG. 4, in accordance with an embodiment of the present invention.
Figure 11:
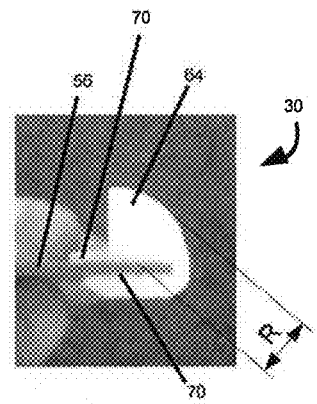
FIG. 11 is another diagram of the curved antenna of the PCB assembly of FIG. 4, in accordance with an embodiment of the present invention.
Figure 7:
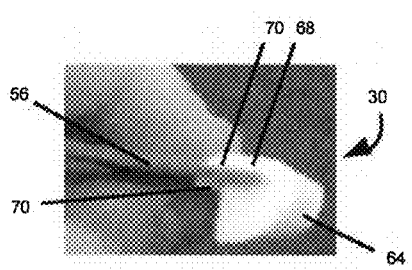
FIG. 7 is another diagram of the curved antenna of the PCB assembly of FIG. 4, in accordance with an embodiment of the present invention.
Figure 8:
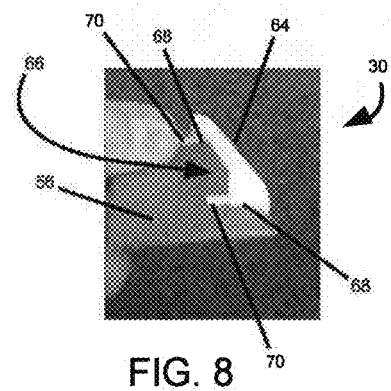
FIG. 8 is another diagram of the curved antenna of the PCB assembly of FIG. 4, in accordance with an embodiment of the present invention.
Figure 12:
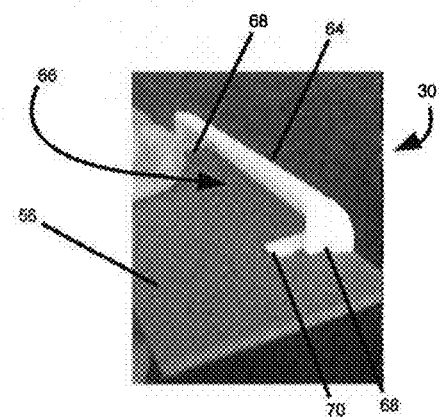
FIG. 12 is another diagram of the curved antenna of the PCB assembly of FIG. 4, in accordance with an embodiment of the present invention.

For example, shown in FIG. 4 is an embodiment of the PCB assembly 28 having four (4) curved antennas 30. As will be appreciated, the antennas 30 may be mounted to an edge of the PCB 56 as shown via a curved mount 64 (best seen in FIGS. 5-12. The curved mount 64 includes an interior cavity 66 (best seen in FIGS. 8 and 12), slits 68 which receive the edge of the PCB 56, and/or or more support legs 70 that fit over/under and/or otherwise mount to the PCB 56. As will be understood, in embodiments, the interior cavity 66 has a curved shape, while the exterior of the curved mount 64 may be of any shape. Further, the curved mount 64 may be made from plastics, metals that do not substantially interfere with the transmission of radio waves, wood, and/or other suitable materials.

Figure 13:
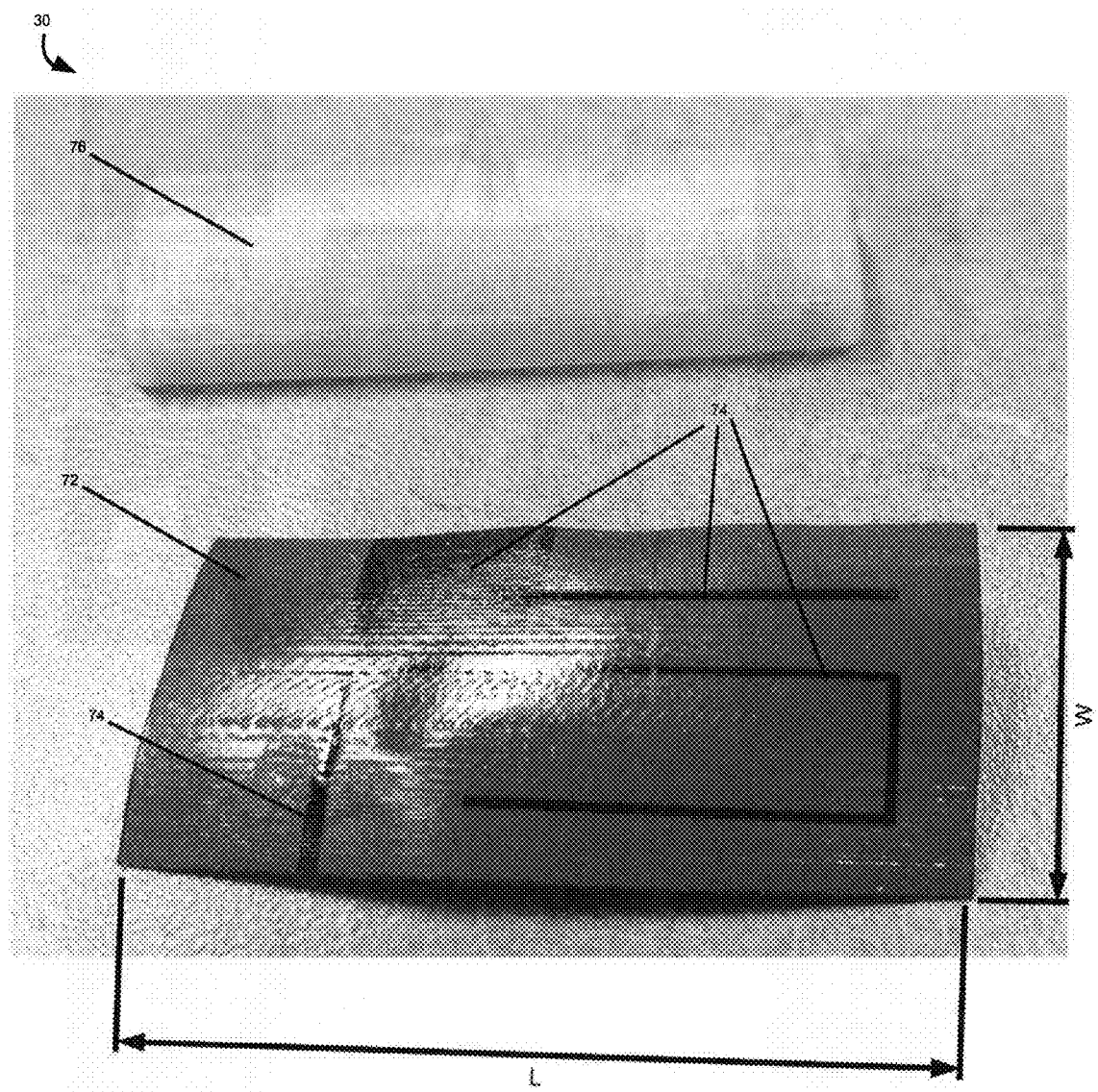
FIG. 13 is a diagram of a flexible PCB of the curved antenna of FIGS. 4-12, in accordance with an embodiment of the present invention.

As shown in FIG. 13, an antenna 30 may be formed from a flexible PCB 72. In embodiments, the flexible PCB 72 may have a length L of about 3.55 inches, a width W of about 2.5 inches, and/or a height of about 0.85 inches. In embodiments, the flexible PCB 72 may have a length L of about 90.2 mm, a width W of about 63.5 mm, and/or a height of about 21.7 mm. As will be appreciated, the flexible PCB 72 may be curved such that it has a radius R (best seen in FIG. 11) of about 0.25 inches. As further shown in FIG. 13, the flexible PCB 72 may include one or more printed wires 74. As will be appreciated, the design/configuration of the antenna 30, to include the radius R, length L, width W, and/or the arrangement of the wires 74 on the flexible PCB 72 may be adapted to transmit and/or receive signals in accordance with Wifi, Bluetooth, Cellular, and/or other wireless protocols. The antenna 30 may also include a curved backing 76 which maintains the curved shape of the flexible PCB 72. In other words, the flexible PCB 72 may be wrapped around the backing 76, with the flexible PCB 72 and the backing 76 fixed to the interior cavity 66 of the curved mount 64. Importantly, the specific configuration of the antenna 30 and the curved shape thereof, allows the antenna 30 to be clipped to the edge of the PCB 56, and thus, minimizes the amount of space required to contain the antenna within the housing 24, 26.

Figure 14:
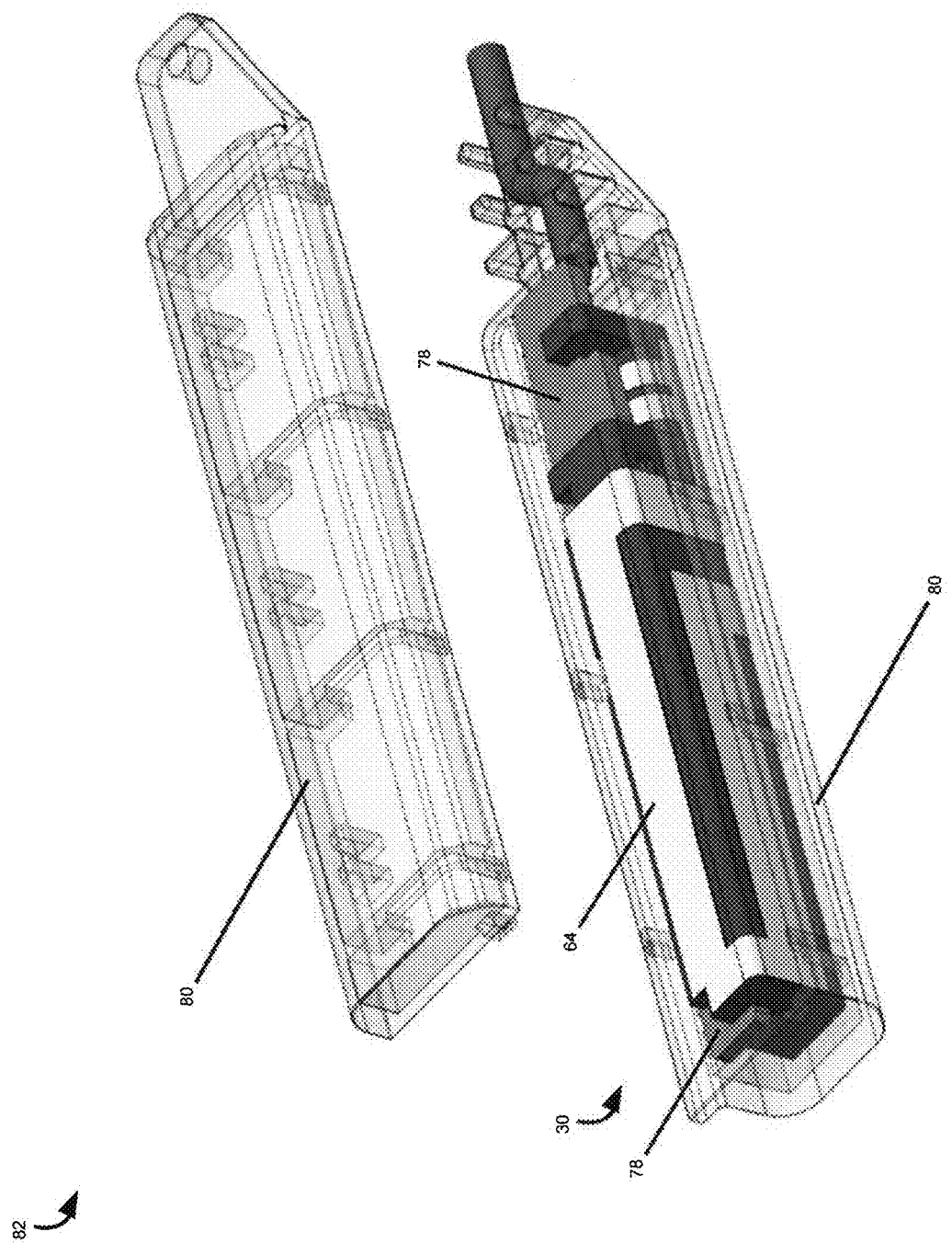
FIG. 14 is an exploded view of an external antenna assembly that incorporates a curved antenna, in accordance with an embodiment of the present invention.

Turning now to FIG. 14, in embodiments, a curved antenna 30 may be fixed via a curved mount 64 to an elongated PCB 78 disposed inside the housing 80 of an external antenna assembly 82, e.g., a rabbit ear. The antenna assembly 82 is intended to be external to the housing 24, 26 and may provide for extended signal transmission and reception range.

As will be appreciated, the ability of the antenna 30 to be clipped onto the elongated PCB 78 and the curved shape allows the external antenna assembly 82 to have a smaller form factor than traditional rabbit ear styled antennas for wireless routers. Accordingly, the antenna assembly 82 provides for a small foot print, i.e., minimal use of space, and extended range wireless router.

Finally, it is also to be understood that the router 10 may include the necessary electronics, software, memory, storage, databases, firmware, logic/state machines, microprocessors, communication links, displays or other visual or audio user interfaces, printing devices, and any other input/output interfaces to perform the functions described herein and/or to achieve the results described herein which may be in real-time. For example, as previously mentioned, the system may include at least one processor and system memory/data storage structures, which may include random access memory (RAM) and read-only memory (ROM). The at least one processor of the system may include one or more conventional microprocessors and one or more supplementary co-processors such as math co-processors or the like. The data storage structures discussed herein may include an appropriate combination of magnetic, optical and/or semiconductor memory, and may include, for example, RAM, ROM, flash drive, an optical disc such as a compact disc and/or a hard disk or drive.

Additionally, a software application that adapts the controller to perform the methods disclosed herein may be read into a main memory of the at least one processor from a computer-readable medium. The term "computer-readable medium", as used herein, refers to any medium that provides or participates in providing instructions to the at least one processor of the router 10 (or any other processor of a device described herein) for execution. Such a medium may take many forms, including but not limited to, non-volatile media and volatile media. Non-volatile media include, for example, optical, magnetic, or opto-magnetic disks, such as memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, a RAM, a PROM, an EPROM or EEPROM (electronically erasable programmable read-only memory), a FLASH-EEPROM, any other memory chip or cartridge, or any other medium from which a computer can read.

While in embodiments, the execution of sequences of instructions in the software application causes at least one processor to perform the methods/processes described herein, hard-wired circuitry may be used in place of, or in combination with, software instructions for implementation of the methods/processes of the present invention. Therefore, embodiments of the present invention are not limited to any specific combination of hardware and/or software.

It is further to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

For example, in an embodiment, a miniaturized wireless router is provided. The miniaturized wireless router includes a housing and at least one network interface disposed therein. The housing has an effective volume of less-than-or-equal-to about 7.5 square inches.

Other embodiments provide for another miniaturized wireless router. The miniaturized wireless router includes a housing and at least one network interface. The at least one network interface includes a curved antenna disposed within the housing. In certain embodiments, the housing has a volume less-than-or-equal-to about 7.5 square inches. In certain embodiments, the miniaturized wireless router further includes a printed circuit board disposed within the housing. In such embodiments, the curved antenna is disposed along an edge of the printed circuit. In certain embodiments, the curved antenna is mounted to the edge via a curved mount. In certain embodiments, the curved antenna is formed from a flexible printed circuit board. In certain embodiments, the flexible printed circuit board has a length and a width less-than-or-equal-to about 3.55 inches and 2.5 inches, respectively. In certain embodiments, the curved antenna is operative to transmit and receive at least one of a Wifi, Bluetooth, and Cellular signal. In certain embodiments, the miniaturized wireless router further includes a memory storage drive.

Other embodiments provide for a system. The system includes a miniaturized wireless router, a first network device, and a second network device. The miniaturized wireless router includes a housing and at least one network interface. The at least one network interface has a curved antenna disposed within the housing. The first network device and the second network device are operative to electronically communicate with each other via the miniaturized wireless router. In certain embodiments, the housing has a volume less-than-or-equal-to about 7.5 square inches. In certain embodiments, the miniaturized wireless router further includes a printed circuit board disposed within the housing. In such embodiments, the curved antenna is disposed along an edge of the printed circuit. In certain embodiments, the curved antenna is mounted to the edge via a curved mount. In certain embodiments, the curved antenna is formed from a flexible printed circuit board. In certain embodiments, the flexible printed circuit board has a length and a width less-than-or-equal-to about 3.55 inches and 2.5 inches, respectively. In certain embodiments, the curved antenna is operative to transmit and receive at least one of a Wifi, Bluetooth, and Cellular signal. In certain embodiments, the miniaturized wireless router further includes a memory storage drive.

Yet still other embodiments provide for a method. The method includes: placing a first network device in electronic communication with a second network device via a miniaturized wireless router that includes a housing and at least one network interface. The at least one network interface includes a curved antenna disposed within the housing. In certain embodiments, the housing has a volume less-thanor-equal-to about 7.5 square inches. In certain embodiments, the miniaturized wireless router further includes a printed circuit board disposed within the housing. In such embodiments, the curved antenna is disposed along an edge of the printed circuit. In certain embodiments, the curved antenna is mounted to the edge via a curved mount. In certain embodiments, the curved antenna is formed from a flexible printed circuit board. In certain embodiments, the flexible printed circuit board has a length and a width less-than-or-equal-to about 3.55 inches and 2.5 inches, respectively. In certain embodiments, placing a first network device in electronic communication with a second network device via a miniaturized wireless router includes receiving at least one of a Wifi, Bluetooth, and Cellular signal via the curved antenna. In certain embodiments, placing a first network device in electronic communication with a second network device via a miniaturized wireless router includes transmitting at least one of a Wifi, Bluetooth, and Cellular signal via the curved antenna. In certain embodiments, the miniaturized wireless router further includes a memory storage device.

Accordingly, as will be appreciated, by providing a miniature wireless router, some embodiments of the invention provide for the ability to provide network connectivity in a form factor smaller than existing designs. Accordingly, some embodiments of the invention may provide for the ability to deploy a wireless router in embedded environments that are too small for existing wireless routers.

Additionally, while the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format are not intended to be interpreted as such, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description shown in the accompanying drawings shall be interpreted merely as examples illustrating the inventive concept herein and shall not be construed as limiting the invention.

What is claimed is:

1. A miniaturized wireless router comprising:
   a housing;
   at least one network interface that includes a curved antenna disposed within the housing; and
   a printed circuit board disposed within the housing, the printed circuit board having a facing surface for mounting of at least one of a processor and/or a memory device to the facing surface, and a backing surface opposite the facing surface;
   wherein the curved antenna is disposed along and around an edge of the printed circuit board such that the curved antenna extends from a point overlying the facing surface of the printed circuit board, around the edge of the printed circuit board, to a point overlying the backing surface of the printed circuit board.

2. The miniaturized wireless router of claim 1, wherein the housing has a volume less-than-or-equal-to about 7.5 square inches.

3. The miniaturized wireless router of claim 1, wherein the curved antenna is mounted to the edge via a curved mount.

4. The miniaturized wireless router of claim 1, wherein the curved antenna is formed from a flexible printed circuit board.

5. The miniaturized wireless router of claim 4, wherein the flexible printed circuit board has a length and a width less-than-or-equal-to about 3.55 inches and 2.5 inches, respectively.

6. The miniaturized wireless router of claim 1, wherein the curved antenna is operative to transmit and receive at least one of a Wifi, Bluetooth, and Cellular signal.

7. The miniaturized wireless router of claim 1 further comprising:
   a memory storage drive,
   wherein the memory storage drive is the memory storage device mounted to the facing surface of the printed circuit board.

8. A system, comprising:
   a miniaturized wireless router that includes a housing, a printed circuit board disposed within the housing, and at least one network interface, the printed circuit board having a facing surface for mounting of at least one of a processor and/or a memory device to the facing surface, and a backing surface opposite the facing surface;
   a first network device and a second network device operative to electronically communicate with each other via the miniaturized wireless router; and
   wherein the at least one network interface has a curved antenna disposed within the housing along and around an edge of the printed circuit board, the curved antenna extending from a point overlying the facing surface of the printed circuit board, around the edge of the printed circuit board, to a point overlying the backing surface of the printed circuit board.

9. The system of claim 8, wherein the housing has a volume less-than-or-equal-to about 7.5 square inches.

10. The system of claim 8, wherein the curved antenna is mounted to the edge via a curved mount.

11. The system of claim 8, wherein the curved antenna is formed from a flexible printed circuit board.

12. The system of claim 11, wherein the flexible printed circuit board has a length and a width less-than-or-equal-to about 3.55 inches and 2.5 inches, respectively.

13. The system of claim 8, wherein the curved antenna is operative to transmit and receive at least one of a Wifi, Bluetooth, and Cellular signal.

14. The system of claim 8, wherein the miniaturized wireless router further includes memory storage device.

15. A method, comprising the steps of:
 mounting at least one of a processor and/or a memory storage device to a facing surface of a printed circuit board, the printed circuit board having a backing surface opposite the facing surface;
 coupling a curved antenna to the printed circuit board such that the curved antenna, when coupled to the printed circuit board, extends from a point overlying the facing surface of the printed circuit board, around an edge of the printed circuit board, to a point overlying the backing surface of the printed circuit board.

16. The miniaturized wireless router of claim 1, further comprising:
 the memory storage device;
 wherein the printed circuit board is shaped so as to fit around the memory storage device such that the memory storage device extends beyond the facing surface of the printed circuit board and the backing surface of the printed circuit board when mounted to the printed circuit board.

17. The miniaturized wireless router of claim 1, further comprising:
 the memory storage device;
 wherein the printed circuit board is shaped so as to fit around the memory storage device such that the memory storage device extends beyond the facing surface of the printed circuit board and the backing surface of the printed circuit board when mounted to the printed circuit board.

\* \* \* \* \*